(12) United States Patent
Ning et al.

(10) Patent No.: US 9,864,831 B2
(45) Date of Patent: Jan. 9, 2018

(54) METROLOGY PATTERN LAYOUT AND METHOD OF USE THEREOF

(71) Applicant: GLOBALFOUNDRIES Inc., Grand Cayman (KY)

(72) Inventors: Guoxiang Ning, Clifton Park, NY (US); Guido Ueberreiter, Dresden (DE); Lloyd C. Litt, Latham, NY (US); Paul Ackmann, Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 59 days.

(21) Appl. No.: 15/071,890

(22) Filed: Mar. 16, 2016

(65) Prior Publication Data

US 2016/0196381 A1   Jul. 7, 2016

Related U.S. Application Data

(62) Division of application No. 14/228,611, filed on Mar. 28, 2014, now Pat. No. 9,323,882.

(51) Int. Cl.
| | | |
|---|---|---|
| G06F 17/00 | (2006.01) | |
| G06F 17/50 | (2006.01) | |
| G03F 1/36 | (2012.01) | |
| G03F 7/20 | (2006.01) | |
| G03F 1/68 | (2012.01) | |

(52) U.S. Cl.
CPC ........... *G06F 17/5081* (2013.01); *G03F 1/36* (2013.01); *G03F 1/68* (2013.01); *G03F 7/70441* (2013.01); *G03F 7/70516* (2013.01); *G03F 7/70625* (2013.01); *G03F 7/70683* (2013.01); *G06F 17/5072* (2013.01)

(58) Field of Classification Search
USPC .......................................................... 716/53
See application file for complete search history.

(56) References Cited

U.S. PATENT DOCUMENTS

| | | |
|---|---|---|
| 5,552,718 A | 9/1996 | Bruce et al. |
| 5,849,440 A | 12/1998 | Lucas et al. |
| 5,900,340 A | 5/1999 | Reich et al. |
| 5,920,487 A | 7/1999 | Reich et al. |
| 6,048,649 A | 4/2000 | Burke et al. |
| 6,171,739 B1 | 1/2001 | Spence et al. |
| 6,218,200 B1 | 4/2001 | Chen et al. |
| 6,228,743 B1 | 5/2001 | Chen et al. |

(Continued)

*Primary Examiner* — Mohammed Alam
(74) *Attorney, Agent, or Firm* — Heslin Rothenberg Farley & Mesiti P.C.

(57) ABSTRACT

A metrology pattern layout for a circuit structure is provided, the metrology pattern layout including a plurality of quadrants, in which quadrants a first wafer measurement pattern, a second wafer measurement pattern, a reticle registration pattern, and a reticle measurement pattern may be arranged to facilitate correlation of reticle metrology data with wafer metrology data. The reticle registration pattern may further include one or more outermost structural elements designed to protect other structural elements within the reticle measurement pattern from being modified in an optical proximity correction process. A method of optical proximity correction process is provided, in which a reticle measurement pattern may be obtained and classified to add or modify a rule set of the optical proximity correction process.

20 Claims, 9 Drawing Sheets

(56) References Cited

U.S. PATENT DOCUMENTS

| | | |
|---|---|---|
| 6,324,481 B1 | 11/2001 | Atchison et al. |
| 6,345,210 B1 | 2/2002 | Yu |
| 6,472,108 B1 | 10/2002 | Lin |
| 6,510,730 B1 | 1/2003 | Phan et al. |
| 6,709,793 B1 | 3/2004 | Brankner et al. |
| 9,053,269 B1 | 6/2015 | Cheng |
| 2001/0052107 A1 | 12/2001 | Anderson et al. |
| 2004/0044431 A1 | 3/2004 | Pellegrini |
| 2004/0181728 A1 | 9/2004 | Pellegrini |
| 2009/0053627 A1 | 2/2009 | Ausschnitt |
| 2013/0198697 A1* | 8/2013 | Hotzel ................ G03F 1/24 716/51 |
| 2013/0295698 A1* | 11/2013 | Pforr ................ G03F 1/38 438/14 |
| 2015/0278426 A1* | 10/2015 | Ning ................ G06F 17/5072 716/53 |
| 2016/0196381 A1* | 7/2016 | Ning ................ G06F 17/5072 716/53 |

\* cited by examiner

METROLOGY PATTERN LAYOUT AND METHOD OF USE THEREOF

CROSS REFERENCE TO RELATED APPLICATIONS

This application is a divisional application of U.S. patent application Ser. No. 14/228,611, filed Mar. 28, 2014, and entitled "METROLOGY PATTERN LAYOUT AND METHOD OF USE THEREOF," the entirety of which is hereby incorporated herein by reference.

FIELD OF THE INVENTION

The present invention generally relates to fabrication of circuit structures, and more particularly, to metrology pattern layouts for circuit structures.

BACKGROUND

The fabrication of integrated circuits generally requires the formation of multiple integrated circuit structures on a wafer or on one or more layers over the wafer. These structures are frequently formed through a photolithography process, which may include a reticle (also called a mask or photomask) through which ultraviolet light is transmitted to the wafer. The reticle blocks the light in areas of the wafer to remain unetched, and permits light to pass through areas to be etched. Photolithography processes may further require metrology steps to ensure proper sizing and alignment of structures within a layer or between layers. Metrology may not only be required to measure alignments on the wafer but also on the reticle. Generally, reticle metrology may be carried out separately from wafer metrology. However, it may be difficult or not possible to accurately correlate reticle metrology data with wafer metrology data. There thus persists a need for tools to correlate reticle metrology with wafer metrology for more precise circuit structure fabrication.

SUMMARY OF THE INVENTION

The shortcomings of the prior art are overcome and additional advantages are provided through the provision, in one aspect, of a method including: facilitating arrangement of a plurality of metrology patterns for a metrology pattern layout for a circuit structure including a plurality of quadrants, including: arranging a first quadrant for a first wafer measurement pattern; arranging a second quadrant for a second wafer measurement pattern; arranging a third quadrant for a reticle registration pattern; arranging a fourth quadrant for a reticle measurement pattern; wherein an arrangement of the plurality of quadrants facilitates correlation of data obtained from the first and second wafer measurement patterns with data obtained from the reticle measurement pattern and the reticle registration pattern.

Also provided herein, in another aspect, is a method including: a process of optical proximity correction to be applied to a reticle, including: providing input graphical data; providing one or more rules for optical proximity correction and pattern protection, wherein the rules apply to a designed pattern for the reticle; obtaining a reticle measurement pattern from a metrology pattern layout; classifying the reticle measurement pattern; applying a bias compensation table to the one or more rules, the bias compensation table chosen according to the classification of the reticle measurement pattern; and, providing output graphical data.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

In one or more embodiments, the structures provided herein overcome the shortcomings of previous metrology structures by providing a metrology pattern layout for a circuit structure that includes a plurality of quadrants facilitating arrangement of a plurality of metrology patterns, including: a first quadrant for a first wafer measurement pattern; a second quadrant for a second wafer measurement pattern; a third quadrant for a reticle registration pattern; a fourth quadrant for a reticle measurement pattern; in which, an arrangement of the plurality of quadrants facilitates correlation of data obtained from the first and second wafer measurement patterns with data obtained from the reticle measurement pattern and the reticle registration pattern.

In additional embodiments, the fourth quadrant may include a reticle measurement pattern that includes a plurality of structural elements, in which at least one of the structural elements is an outermost element that is designed to protect the plurality of structural elements from being modified in an optical proximity correction process.

In other embodiments, the metrology pattern layout may further include a scribe area that may contain additional metrology patterns, such as pattern recognition metrology patterns or double-patterning metrology patterns. The scribe area may, for instance, form a border around the plurality of quadrants, or it may be in the center of the metrology patterns, forming a cross-shaped scribe area that separates the quadrants.

In another aspect, provided herein a method that includes a process of optical proximity correction to be applied to a reticle, the process including: providing input graphical data; providing one or more rules for optical proximity correction and pattern protection, wherein the rules apply to a designed pattern for the reticle; obtaining a reticle measurement pattern from a metrology pattern layout; classifying the reticle measurement pattern; applying a bias compensation table to the one or more rules, the bias compensation table chosen according to the classification of the reticle measurement pattern; and, providing output graphical data.

Reference is made below to the drawings, which are not drawn to scale for ease of understanding, wherein the same reference numbers used throughout different figures designate the same or similar components.

Figure 1A:
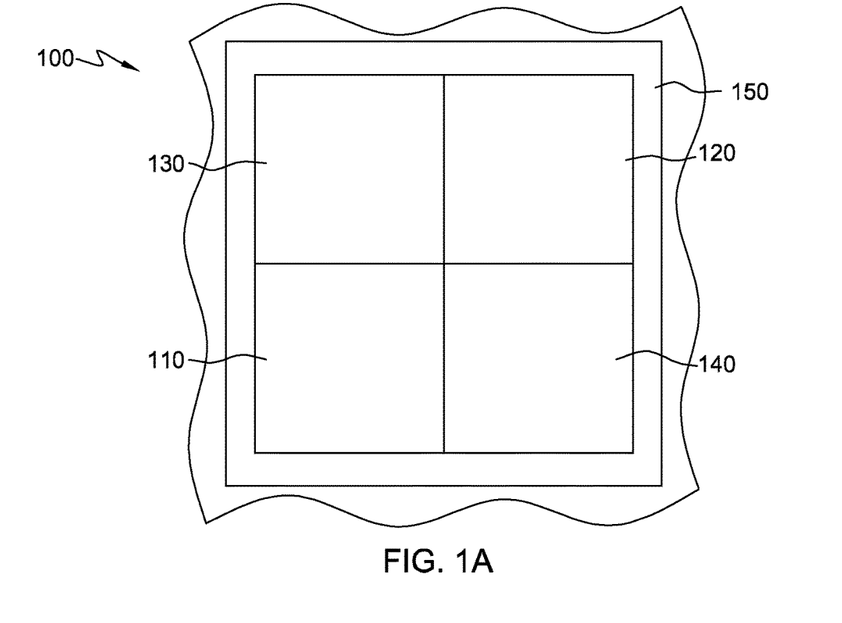
FIG. 1A depicts an exemplary embodiment of a metrology pattern layout, in accordance with one or more aspects of the invention.

FIG. 1 depicts an embodiment of a metrology pattern layout 100 with a plurality of quadrants, as may be included on a reticle or a wafer. Pattern layout 100 includes a first quadrant 110 for a first wafer metrology pattern, a second quadrant 120 for a second wafer metrology pattern, a third quadrant 130 for a reticle registration pattern, and a fourth quadrant 140 for a reticle measurement pattern. In the example depicted, first quadrant 110 and second quadrant 120 are arranged diagonally across from each other, and similarly third quadrant 130 and fourth quadrant 140 are arranged diagonally across from each other. Metrology pattern layout 100 may further include a scribe area 150. Scribe area 150 may be square-shaped as illustrated, and may form, in part, a border of metrology pattern layout 100, such that the plurality of quadrants are disposed within the scribe area. Scribe area 150 may be of any width needed to accommodate one or more additional metrology patterns, aside from the metrology patterns placed in the plurality of quadrants. As further detailed below, these additional metrology patterns may be for pattern recognition, aligning metal layers, aligning exposure layers for a double patterning process, and so on. Metrology pattern layout 100 may further have a surface area on a reticle or wafer defined by the total length and total width of the layout, including the plurality of quadrants and the scribe area, and this surface area may be small enough to permit placement of metrology pattern layout 100 within an active pattern area of the reticle or wafer. Placement of metrology pattern layouts (and included metrology patterns) within an active area of a reticle or wafer pattern may be advantageous over placement in an inactive area, such as near the edge of the reticle or wafer, as it may provide more accurate metrology data. As well, it may be possible to place multiple metrology pattern layouts in several pre-determined regions of the active pattern area; this may facilitate obtaining multiple, localized sets of metrology data, as opposed to data obtained from metrology patterns placed in inactive regions. In one example, the surface area of metrology pattern 100 may be less than about 25 $\mu m^2$.

Figure 1B:
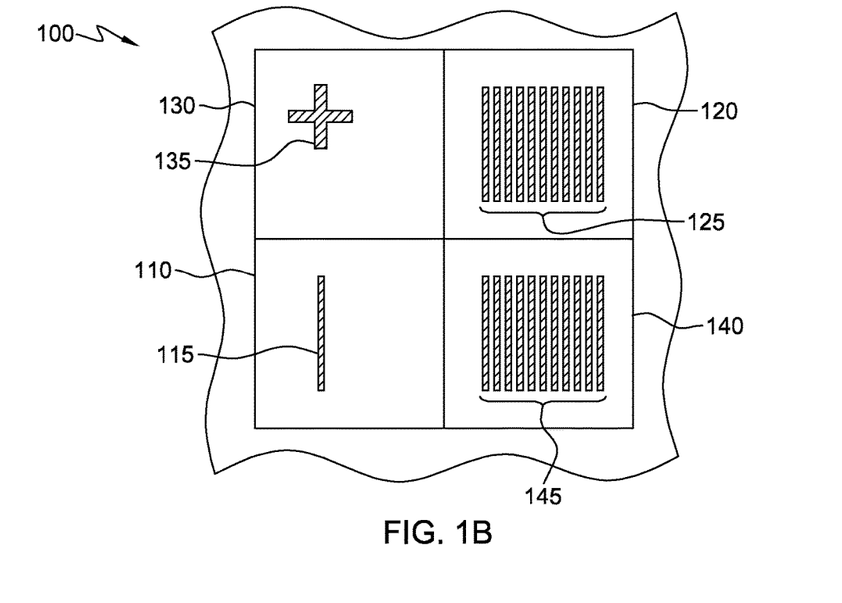
FIG. 1B depicts the metrology pattern layout of FIG. 1A with exemplary metrology patterns arranged in the metrology pattern layout, in accordance with one or more aspects of the invention.

FIG. 1B depicts metrology pattern layout 100 of FIG. 1A with an exemplary arrangement of metrology patterns disposed within the quadrants. In this exemplary embodiment, the scribe area depicted in FIG. 1A is not present. First wafer measurement pattern 115, within first quadrant 110, may be, for example, a single structural element, such as the single line segment illustrated. First wafer measurement pattern 115 may, in other examples, include a plurality of structural elements. Reticle measurement pattern 135, within third quadrant 130, may also be a single structural element, such as the single cross element illustrated. Second wafer measurement pattern 125, within second quadrant 120, may be a similar pattern to the first wafer measurement pattern, or may include a plurality of structural elements as illustrated. As depicted in this exemplary embodiment, one or more of the structural elements of second wafer measurement pattern 125 may be similar to the one or more structural elements of first wafer measurement pattern 115. Although it may be possible for the first wafer measurement pattern and second wafer measurement pattern to have differing structural elements, conducting metrology of wafer layers may generally be better facilitated by the first and second wafer measurement patterns sharing similar structural elements, as depicted here. Reticle measurement pattern 145, within fourth quadrant 140, may be a pattern similar to second wafer measurement pattern 125. Reticle measurement pattern 145 may include additional structural elements not present in second wafer measurement pattern 125, as described below in further embodiments. Although the reticle measurement pattern and second wafer measurement pattern may have differing patterns and structural elements, in general the correlation of metrology data from reticle measurement with metrology data from wafer measurement may be best facilitated when the reticle measurement pattern an second wafer measurement pattern are similar.

The metrology pattern layout 100 depicted in FIGS. 1A and 1B may realize several advantages over prior metrology pattern layouts. By arranging second quadrant 120 and fourth quadrant 140 as illustrated in FIGS. 1A and 1B, reticle measurement pattern 145 and second wafer measurement pattern 125 may be arranged so that metrology data obtained from each of these patterns may be correlated, thus facilitating correlation of reticle metrology data with wafer metrology data, as desired. Further, third quadrant 130 may arrange reticle registration pattern 135 so that reticle registration pattern 135 is effectively isolated from other metrology patterns within metrology pattern layout 100. This may facilitate minimizing distortion of reticle registration pattern 135 when scanned by a metrology tool.

Figure 2A:
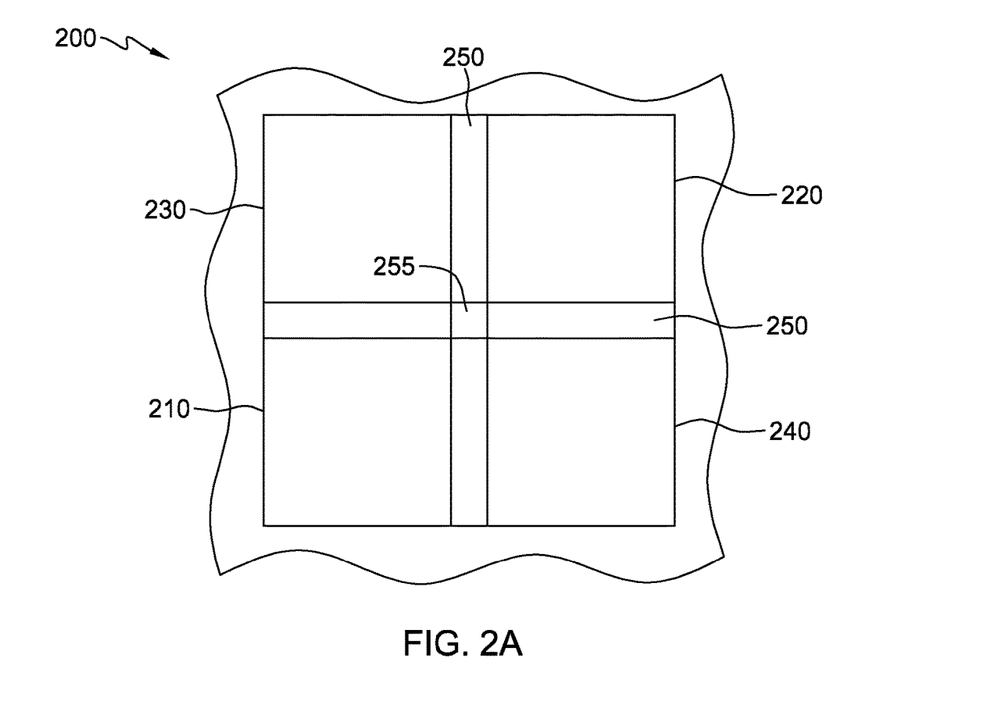
FIG. 2A depicts another exemplary embodiment of a metrology pattern layout, in accordance with one or more aspects of the invention.

FIG. 2A depicts another embodiment of a metrology pattern layout 200 with a plurality of quadrants, including a first quadrant 210 for a first wafer metrology pattern, a second quadrant 220 for a second wafer metrology pattern, a third quadrant 230 for a reticle registration pattern, and a fourth quadrant 240 for a reticle measurement pattern. In the example depicted, first quadrant 210 and second quadrant 220 are arranged diagonally across from each other, and similarly third quadrant 230 and fourth quadrant 240 are arranged diagonally across from each other. Metrology pattern layout 200 may further include a scribe area 250. Scribe area 250 in this example embodiment is a cross-shaped scribe area centrally disposed within metrology pattern layout 200, so that scribe area 250 separates the plurality of quadrants. Scribe area 250, similar to the scribe area depicted in FIG. 1A, may accommodate one or more additional metrology patterns. Scribe area 250 may also have a center area 255, which may also accommodate an additional metrology pattern. As further detailed below, these additional metrology patterns may be for pattern recognition, aligning metal layers, aligning exposure layers for a double patterning process, and so on. As described above in FIG. 1A, metrology pattern layout 200 may have a surface area defined by the total length and total width of the plurality of quadrants and scribe area, and this surface area may be small enough to facilitate placement of metrology pattern 200 within an active area of a reticle or wafer pattern.

Figure 2B:
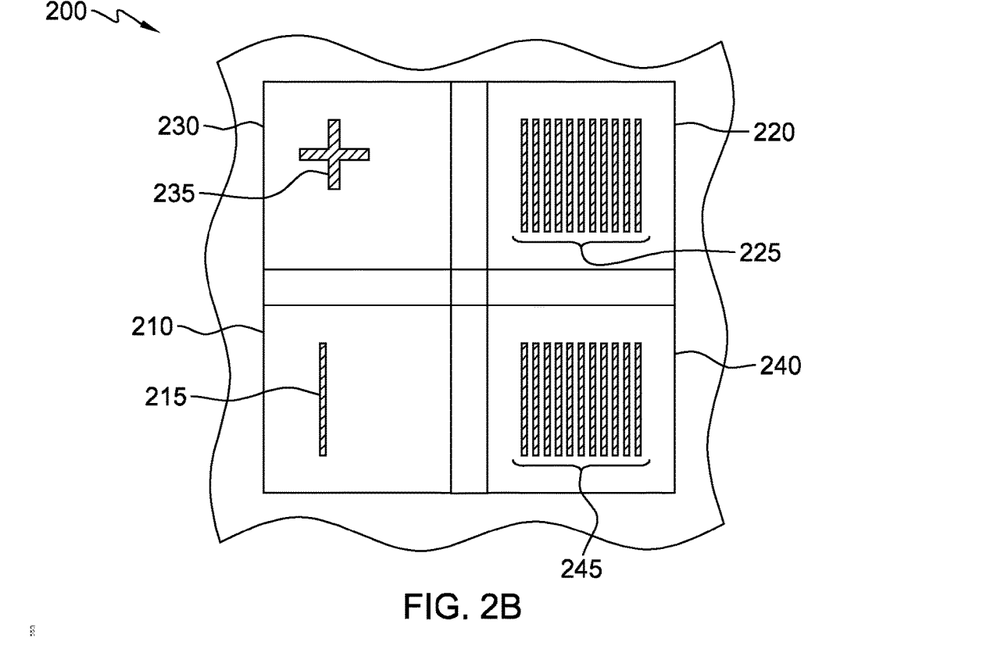
FIG. 2B depicts the metrology pattern layout of FIG. 2A with exemplary metrology patterns arranged in the metrology pattern layout, in accordance with one or more aspects of the invention.

FIG. 2B depicts the metrology pattern layout 200 of FIG. 2A with an exemplary arrangement of metrology patterns disposed within the quadrants, similar to the metrology patterns of FIG. 1A, as described above. First quadrant 210 includes a first wafer measurement pattern 215, second quadrant 220 includes a second wafer measurement pattern 225, third quadrant 230 includes a reticle registration pattern, and fourth quadrant 240 includes a reticle measurement pattern. Metrology pattern 200 may realize similar advantages over prior metrology pattern layouts as metrology pattern 100. With second quadrant 220 and fourth quadrant 240 arranged as illustrated in FIGS. 2A and 2B, reticle measurement pattern 245 and second wafer measurement pattern 225 may be arranged so that metrology data obtained from each of these patterns may be correlated, thus facilitating correlation of reticle metrology data with wafer metrology data, as desired. Further, third quadrant 230 may arrange reticle registration pattern 235 so that reticle registration pattern 235 is effectively isolated from other metrology patterns within metrology pattern layout 200. This may facilitate minimizing distortion of reticle registration pattern 235 when scanned by a metrology tool.

Figure 2C:
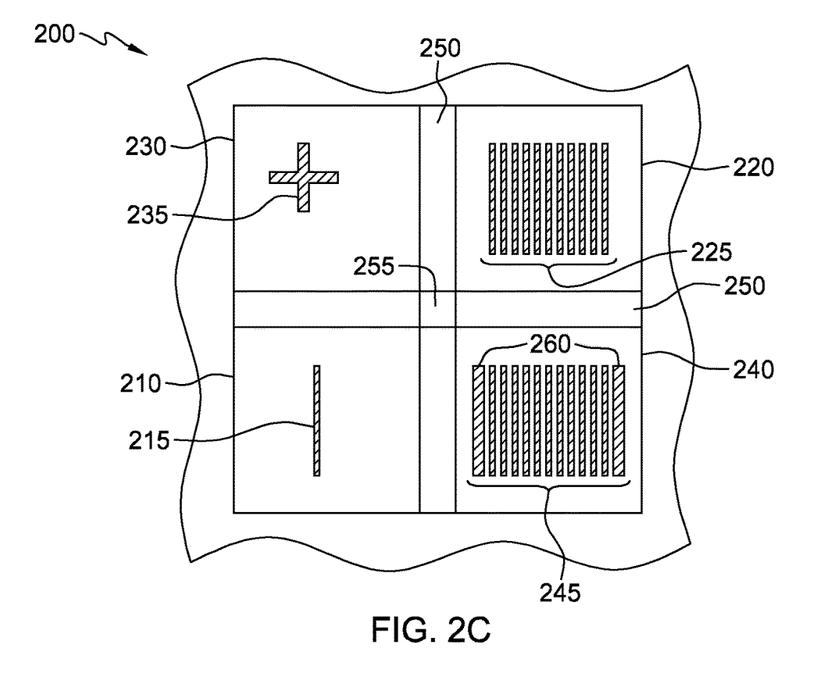
FIG. 2C depicts the metrology pattern layout and metrology patterns of FIG. 2B, in which a reticle measurement pattern includes outermost structural elements to protect the pattern from being modified in an optical proximity correction process, in accordance with one or more aspects of the invention.

FIG. 2C depicts metrology pattern 200 of FIG. 2B, with additional structural elements 260 included as part of reticle measurement pattern 245 in fourth quadrant 240. Additional elements 260 may be one or more outermost structural elements of reticle measurement pattern 245, and may be designed to protect the other structural elements of reticle measurement pattern 245 from being modified during an optical proximity correction process. Optical proximity correction (OPC) processes, in general, may be required in patterning a reticle in order to achieve a desired output pattern on a wafer. OPC processes may generally be performed on a reticle after its ideal pattern is designed; the process may analyze the pattern to determine how the ideal pattern will actually print on the wafer when subjected to a lithography process, accounting for light diffraction and interference and other known physical effects of light transmission through a reticle, and add or subtract small corrections to the structural elements of the pattern. These corrections are intended to compensate for the effects described above in order to achieve a printed wafer pattern that conforms to the ideal pattern as closely as possible. In general, however, it may not be desirable to allow an OPC process to similarly modify a reticle metrology pattern within the reticle, as structural elements within a pattern generally need to be formed with specific length, width, and spacing in order to provide accurate metrology data. These parameters may be distorted by an OPC process. However, without OPC correction, some of the structural elements within a metrology pattern may be distorted anyway due to light diffraction or interference affecting the printing of elements at the outside of the pattern. To compensate for these effects and prevent modifications or damage to the reticle measurement pattern, one or more additional outermost elements 260 may be added to reticle measurement pattern 245. Outermost structural elements 260 may have at least one size dimension that is larger than the corresponding size dimension of the other structural elements. In an exemplary embodiment, this at least one size dimension for the outermost structural elements 260 may be two times larger than a pre-defined critical dimension for the reticle. Outermost structural elements 260 generally may thus be discounted when collecting metrology data from the reticle measurement pattern, as they may not reflect the dimensions of circuit structure features for the corresponding layer. At such dimensions, outermost structural elements 260 may sufficiently correct for such effects as light diffraction and interference so that an OPC process analyzing the pattern will not make modifications to the smaller plurality on structural elements of reticle measurement pattern 245. Further, or in the alternative, outermost structural elements 260 may add or alter the "rules" used in a rule-based OPC process. The OPC process may be configured to obtain the reticle measurement pattern 245 from metrology pattern layout 200 and classify the pattern according to outermost structural elements 260. This classification may add or alter rules applied in the OPC process, so that the OPC process is configured to ignore reticle measurement pattern 245 while still modifying other pattern areas of the reticle.

Figure 2D:
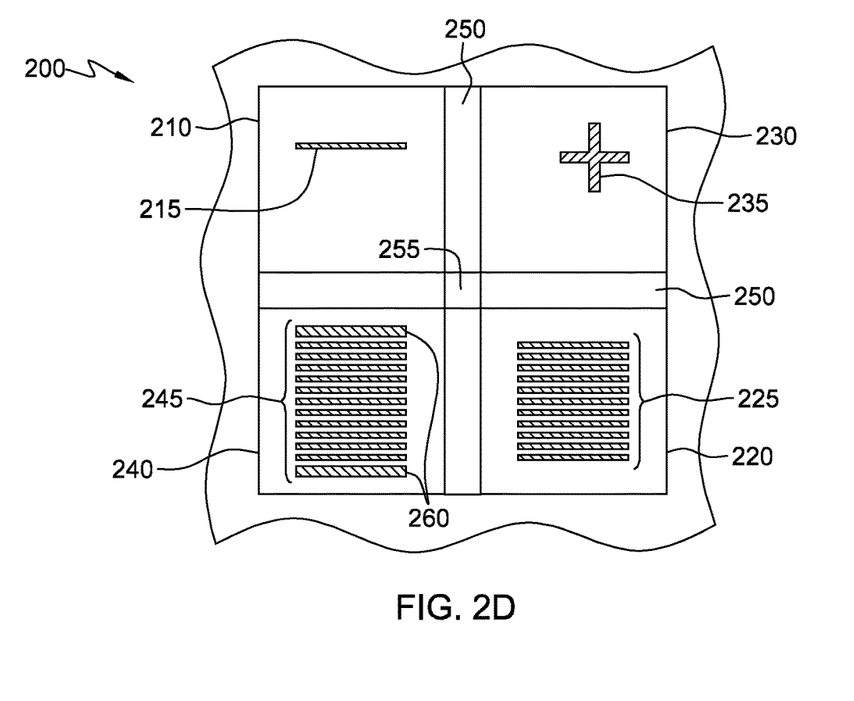
FIG. 2D depicts the metrology pattern layout of FIG. 2C rotated by 90°, in accordance with one or more aspects of the invention.

FIG. 2D depicts metrology pattern layout 200 and metrology patterns 215, 225, 235, 245, of FIG. 2C, rotated by 90° to illustrate how the same metrology pattern may be used for metrology on different layers of a circuit structure. These layers may, for example, be two metal layers formed over the wafer. For many circuit structures, a first metal layer is formed with its structural elements largely or entirely oriented in one direction, and a second metal layer formed over the first is formed with its structural elements largely or entirely oriented perpendicularly to the first metal layer. Frequently the structural elements of the two metal layers may be similar or may even be identical, thus the same reticle and wafer measurement patterns may be applicable to each metal layer if rotated by 90°. Metrology pattern layout 200 facilitates this rotation and provides a layout that can be easily repeated on multiple layers by simply rotating the pattern layout as appropriate for each of the multiple layers. It should be clear that such rotation may also apply to metrology pattern layout 100 from FIGS. 1A and 1B, and is not limited to metrology pattern layout 200.

Figure 2E:
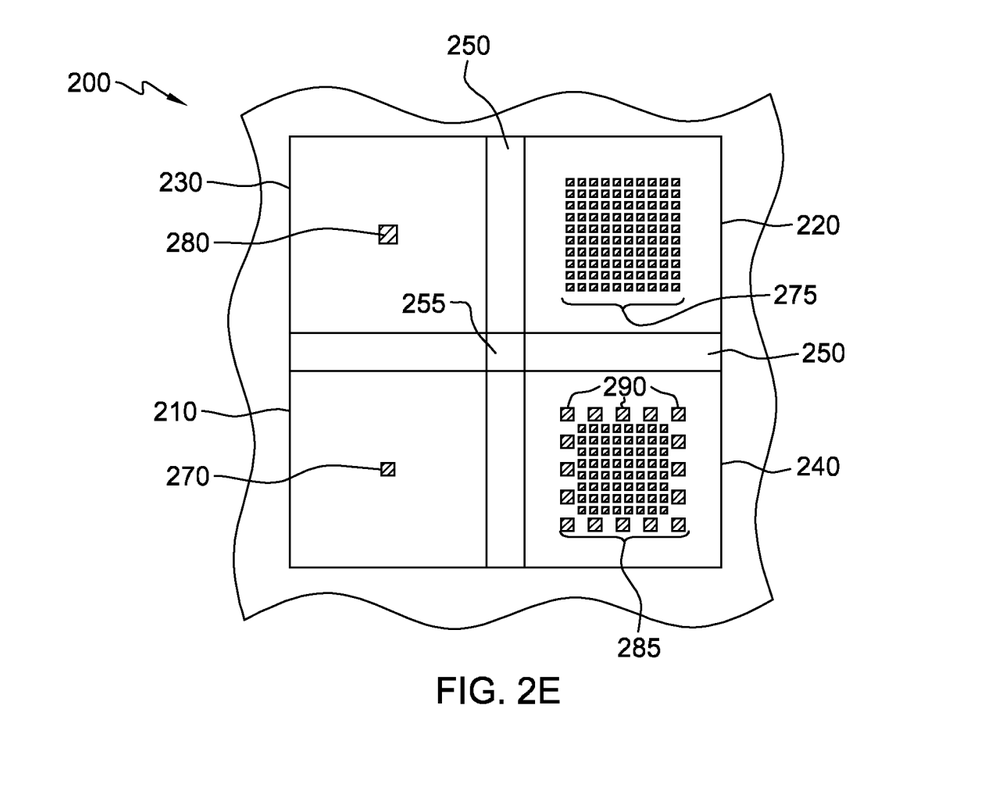
FIG. 2E depicts the metrology pattern layout of FIG. 2A with an alternative set of metrology patterns laid out within the metrology pattern layout, in accordance with one or more aspects of the invention.

FIG. 2E depicts metrology pattern layout 200 with an alternative set of metrology patterns 270, 275, 280, and 285 disposed within the plurality of quadrants to illustrate how the metrology pattern layouts disclosed herein may be used to arrange many types of metrology patterns for different types of circuit structure layers. In the example illustrated, metrology patterns 270, 275, 280, and 285 may be metrology patterns for a via layer, which may be layered between two metal layers of a circuit structure; these metrology patterns may further be applicable to other types of circuit structure layers. Metrology pattern 285 in fourth quadrant 240 may be a reticle measurement pattern, which may include one or more outermost elements 290 for protection from an OPC process. In the example illustrated, the plurality of structural elements of reticle measurement pattern 285 may have two critical dimensions; thus, outermost elements 290 may be larger than the rest of the plurality of structural elements in each of these critical dimensions. It should be clear that such alternative metrology patterns may also be disposed within metrology pattern layout 100 from FIGS. 1A and 1B, and are not limited to being used only with metrology pattern layout 200.

Figure 3A:
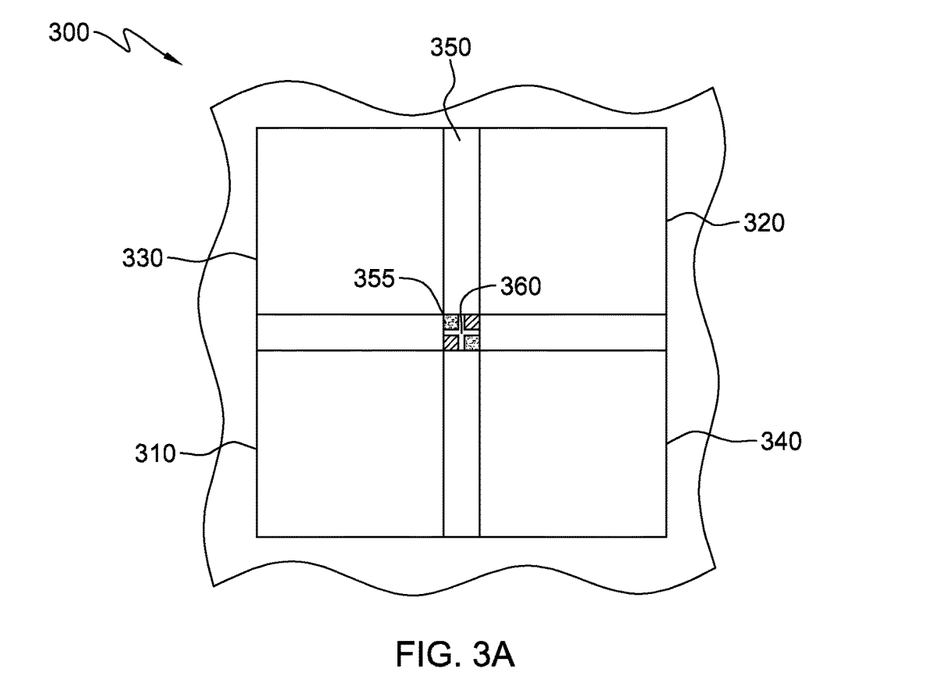
FIG. 3A depicts an embodiment of a metrology pattern layout in which the metrology pattern layout includes a cross-shaped scribe area for an additional metrology pattern, in accordance with one or more aspects of the invention.

FIG. 3A depicts yet another embodiment of a metrology pattern layout 300, similar to that depicted in FIG. 2A, in which the center area 355 of cross-shaped scribe area 350 includes an additional metrology pattern 360. In the example embodiment illustrated, additional metrology pattern 360 may, for instance, be a double-patterning alignment metrology pattern. Alternatively, additional metrology pattern 360 may function as a pattern recognition pattern, or may combine the functions of pattern recognition and alignment metrology. Additional metrology pattern 360 may, in one exemplary embodiment, be an arrangement of four square-shaped blocks, in which the arrangement ideally aligns the edges and corners of the square-shaped blocks, as illustrated in FIG. 3A. Other additional metrology patterns may possibly be placed in center area 355, such as a "box-in-box" pattern.

Figure 3B:
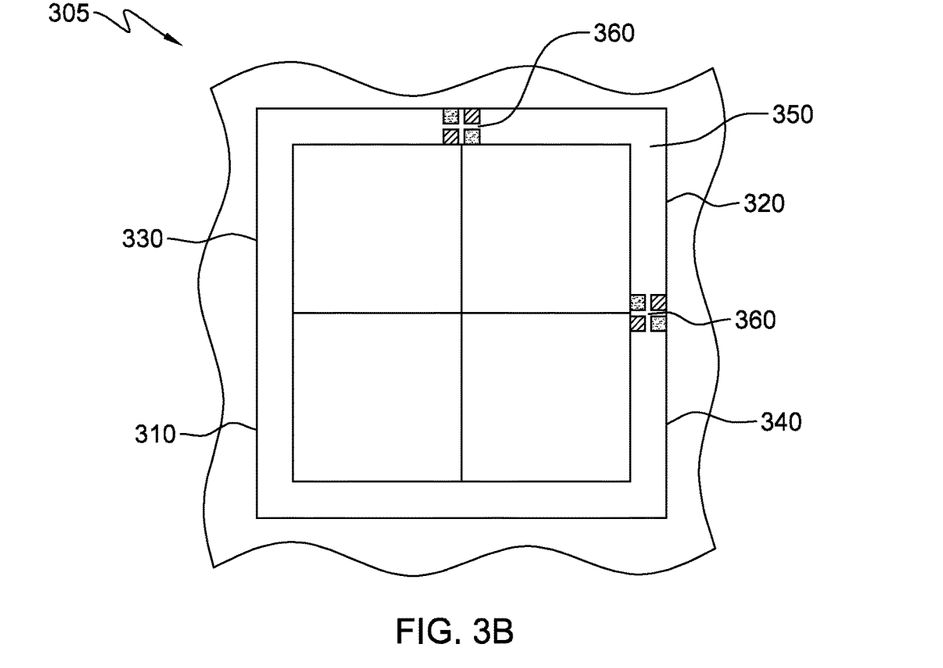
FIG. 3B depicts another embodiment of a metrology pattern layout in which the metrology pattern layout includes a square-shaped scribe area bordering the rest of the metrology pattern layout, the scribe area including one or more additional metrology patterns, in accordance with one or more aspects of the invention.

FIG. 3B depicts another embodiment of a metrology pattern layout 305, similar to that depicted in FIG. 1A, in which scribe area 350 includes one or more additional metrology patterns 360. Additional metrology patterns 360 may be, for example, patterns for double-patterning alignment metrology. In the exemplary embodiment depicted, additional metrology patterns 360 may be disposed within scriber area 350 so that they are aligned with the imaginary lines bordering adjacent quadrants. However, it should be understood that additional metrology patterns 360 may be placed anywhere within the scribe area, and need not be symmetric or equally disposed.

Figure 4A:
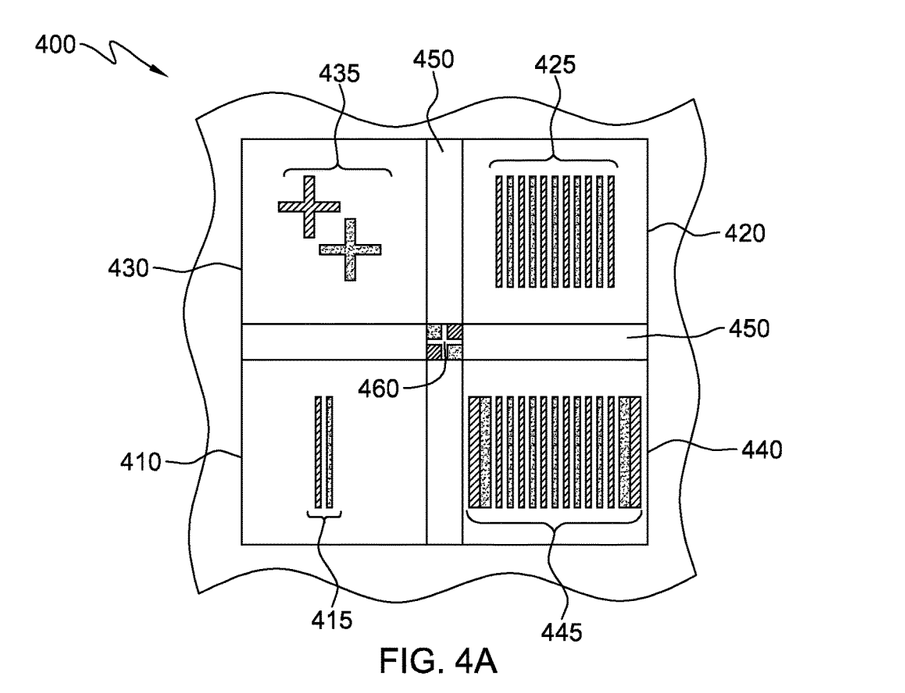
FIG. 4A depicts an embodiment of a metrology pattern layout in which the metrology pattern layout accommodates multiple metrology patterns for measuring alignment of exposure layers of a double-patterning process, in accordance with one or more aspects of the invention.
Figure 4B:
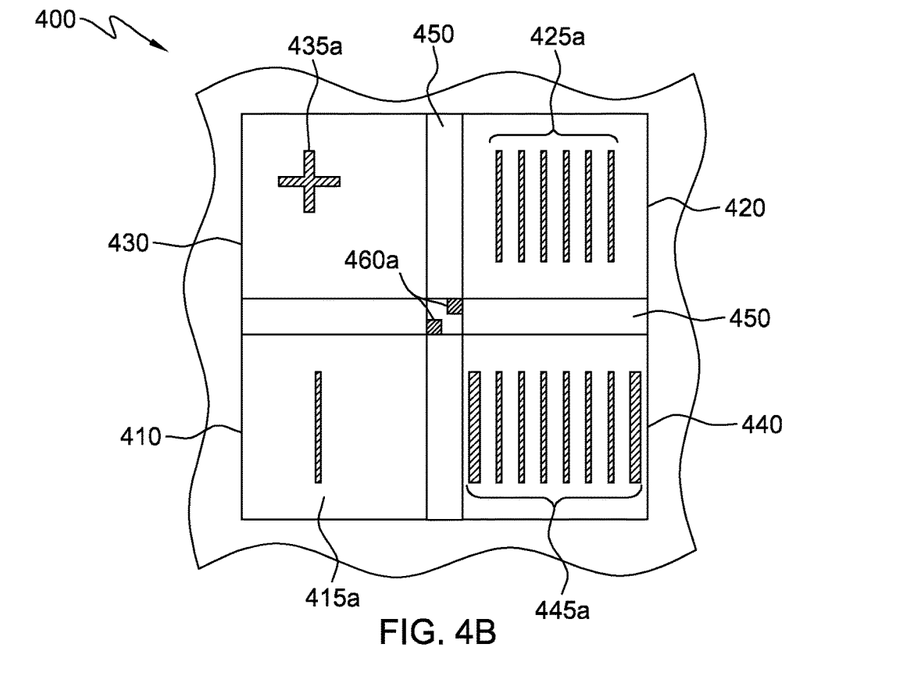
FIG. 4B depicts the metrology pattern layout of FIG. 4A with only the metrology patterns corresponding to a first exposure layer of a double-patterning process included, in accordance with one or more aspects of the invention.
Figure 4C:
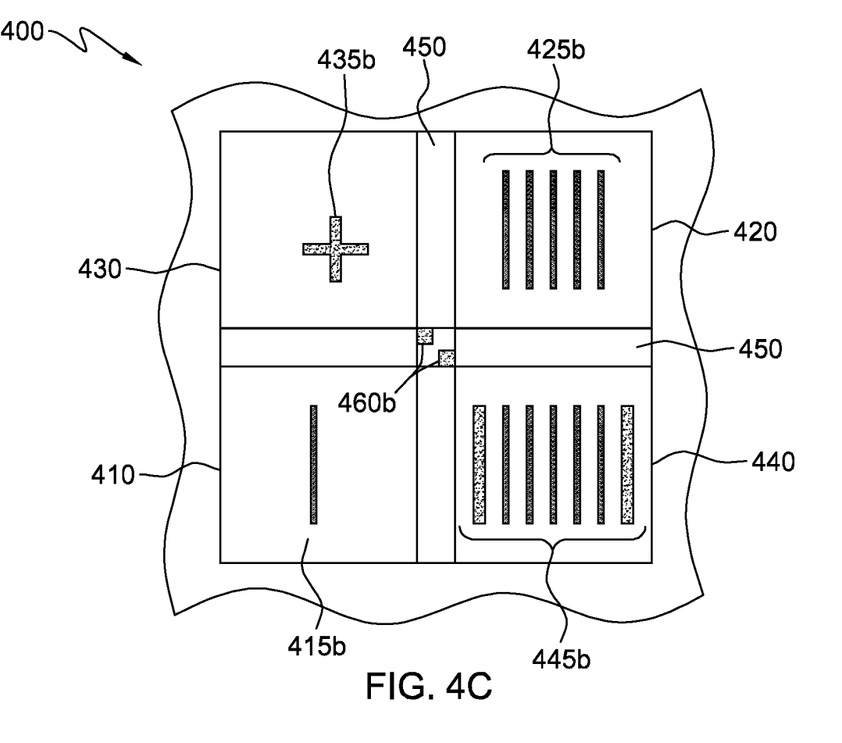
FIG. 4C depicts the metrology pattern layout of FIG. 4A with only the metrology patterns corresponding to a second exposure layer of a double-patterning process included, in accordance with one or more aspects of the invention.

FIGS. 4A through 4C illustrate another embodiment of a metrology pattern layout 400, similar to those depicted in FIGS. 2A and 3A, in which multiple metrology patterns have been arranged within each quadrant 410, 420, 430, 440 to further facilitate alignment metrology for a double-patterning process, in addition to correlating reticle and wafer metrology data and other functions.

FIG. 4A depicts the net result of combining metrology patterns for a first exposure layer and a second exposure layer for a double-patterning process. In the exemplary embodiment depicted, each quadrant accommodates two metrology patterns corresponding to two exposure layers of the double-patterning process, although it may be possible in alternative embodiments to employ fewer quadrants, including just one quadrant that includes two metrology patterns for double-patterning. First wafer pattern 415, for example, includes a first wafer pattern for a first exposure layer and a first wafer pattern for a second exposure layer. Second wafer pattern 425, reticle registration pattern 435, and reticle measurement pattern 445 similarly include patterns corresponding to a first exposure layer and a second exposure layer for the double-patterning process. An additional metrology pattern 460 may be included within scribe area 450 to further measure the alignment of the first exposure layer and second exposure layer of the double-patterning process. Reticle measurement pattern 445 may be designed with a plurality of outermost structural elements designed to protect other structural elements of reticle measurement pattern 445 from an OPC process or multiple OPC processes. An OPC process may be applied, for example, before printing the first exposure layer of the double-patterning layer, and another OPC process may be applied before printing the second exposure layer. Alternatively, an OPC process may be applied for both exposure layers simultaneously.

FIG. 4B depicts the metrology pattern layout 400 of FIG. 4A with only the metrology patterns for the first exposure layer included. First wafer measurement pattern 415*a* and second wafer measurement pattern 425*a* are disposed within first quadrant 410 and 420, respectively, and reticle registration pattern 435*a* is disposed within third quadrant 435. Reticle measurement pattern 445*a*, in fourth quadrant 440, here includes one or more outermost structural elements 470 intended to protect the other structural elements of reticle measurement pattern 445*a* from an OPC process, as described previously. The OPC process may be applied before forming the first exposure layer, and may also be applied before forming the second exposure layer. Additional metrology pattern 460*a* in the center area of scribe area 450 may provide an alignment pattern corresponding to the first exposure layer, which may be used, for example, in conjunction with an alignment pattern corresponding to the second exposure layer (as depicted in FIG. 4A at 460).

FIG. 4C depicts the metrology pattern layout 400 of FIG. 4A with only the metrology patterns for the second exposure layer included. First wafer measurement pattern 415*b* and second wafer measurement pattern 425*b* are disposed within first quadrant 410 and 420, respectively, and reticle registration pattern 435*b* is disposed within third quadrant 435. Reticle measurement pattern 445*b*, in fourth quadrant 440, here includes one or more outermost structural elements 470 intended to protect the other structural elements of reticle measurement pattern 445*a* from an OPC process. The OPC process may be applied before forming the second exposure layer, and may also be applied before forming the first exposure layer. Additional metrology pattern 460*b* in the center area of scribe area 450 may provide an alignment pattern corresponding to the second exposure layer, which may be used, for example, in conjunction with an alignment pattern corresponding to the first exposure layer (as depicted in FIG. 4A at 460).

Figure 5A:
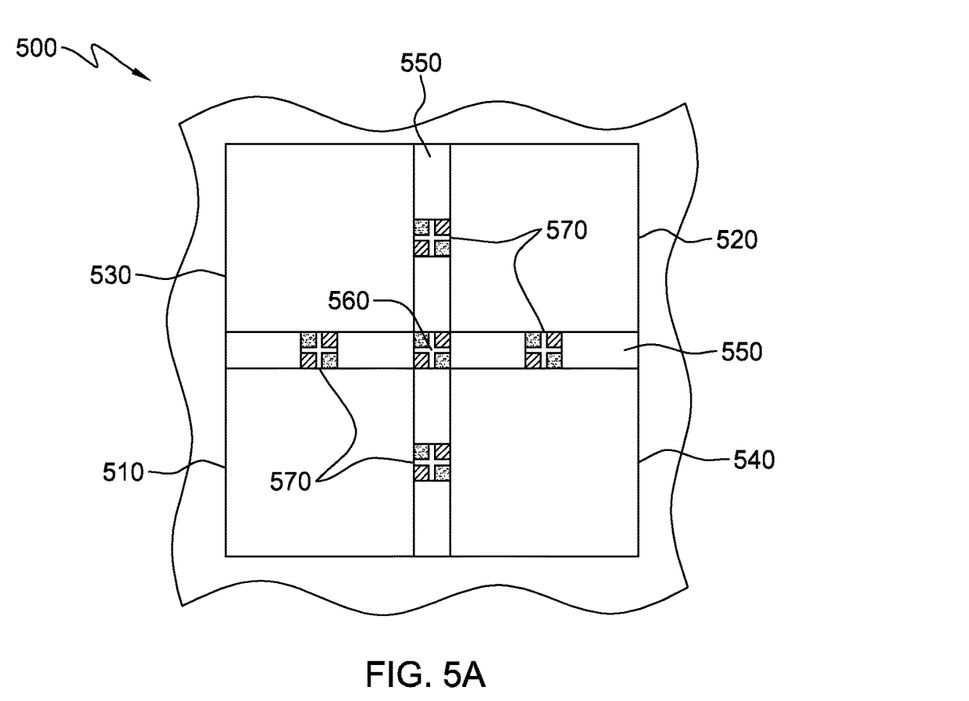
FIG. 5A depicts an embodiment of a metrology pattern layout with an exemplary set of additional metrology patterns arranged within a scribe area of the metrology pattern layout, in accordance with one or more aspects of the invention.
Figure 5B:
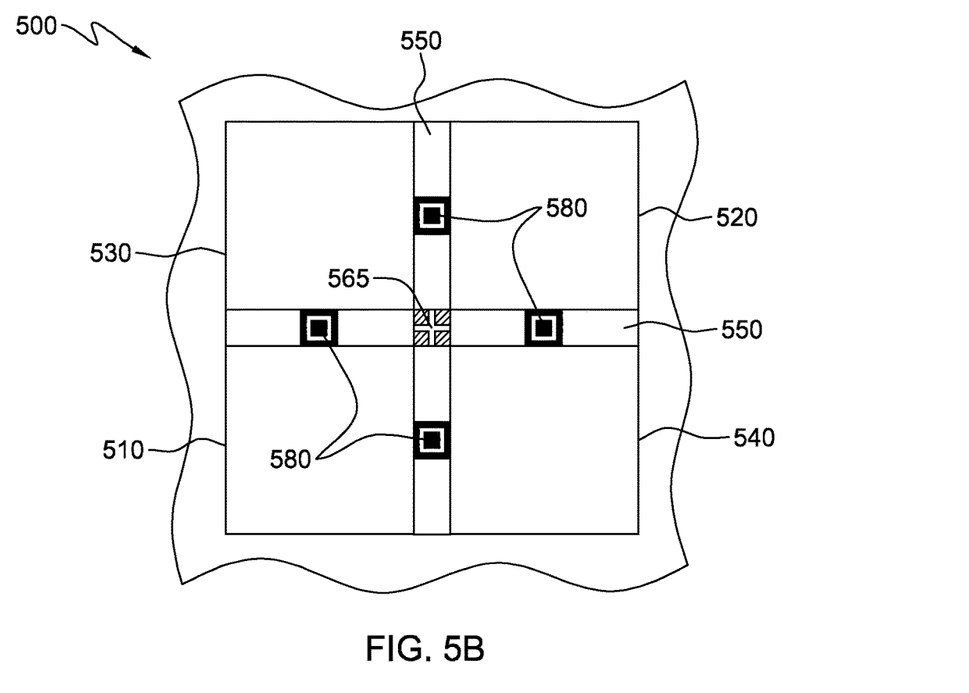
FIG. 5B depicts the metrology pattern layout of FIG. 5A with an alternative exemplary set of additional metrology patterns arranged within a scribe area of the metrology pattern layout, in accordance with one or more aspects of the invention.

FIGS. 5A and 5B illustrate additional embodiments of a metrology pattern layout 500, similar to that depicted in FIG. 2A, in which additional metrology patterns are disposed within a scribe area of metrology pattern layout 500 to illustrate additional uses of the scribe area. FIG. 5A, for example, depicts a plurality of additional patterns 570, which may correspond to double-patterning alignment metrology patterns, being disposed in scribe area 550. Additional patterns 570 may be similar to an additional pattern 560 in the center area of scribe area 550. FIG. 5B, also by way of example, depicts a plurality of additional "box-in-box" patterns 580, which may be used in measuring alignments of two or more metal layers, being disposed in scribe area 550. In the example depicted here, additional pattern 560 in the center of scribe area 550 may be a pattern recognition metrology pattern, and may not necessarily resemble additional patterns 580. Thus, scribe area 550 may include multiple types of additional patterns 560, 580 that serve different metrology functions, within the same metrology pattern layout 500. For example, the additional metrology patterns may correspond to alignment metrology patterns for via layers, such as via contact layers formed between two metal layers.

It may be understood that it may be possible to arrange any type of metrology pattern or patterns, including patterns not explicitly illustrated herein, within the plurality of quadrants and/or the scribe area of the metrology pattern layouts disclosed herein, and any of these various metrology patterns arranged by the disclosed metrology pattern layouts are contemplated as being within the scope of the present invention.

Figure 6:
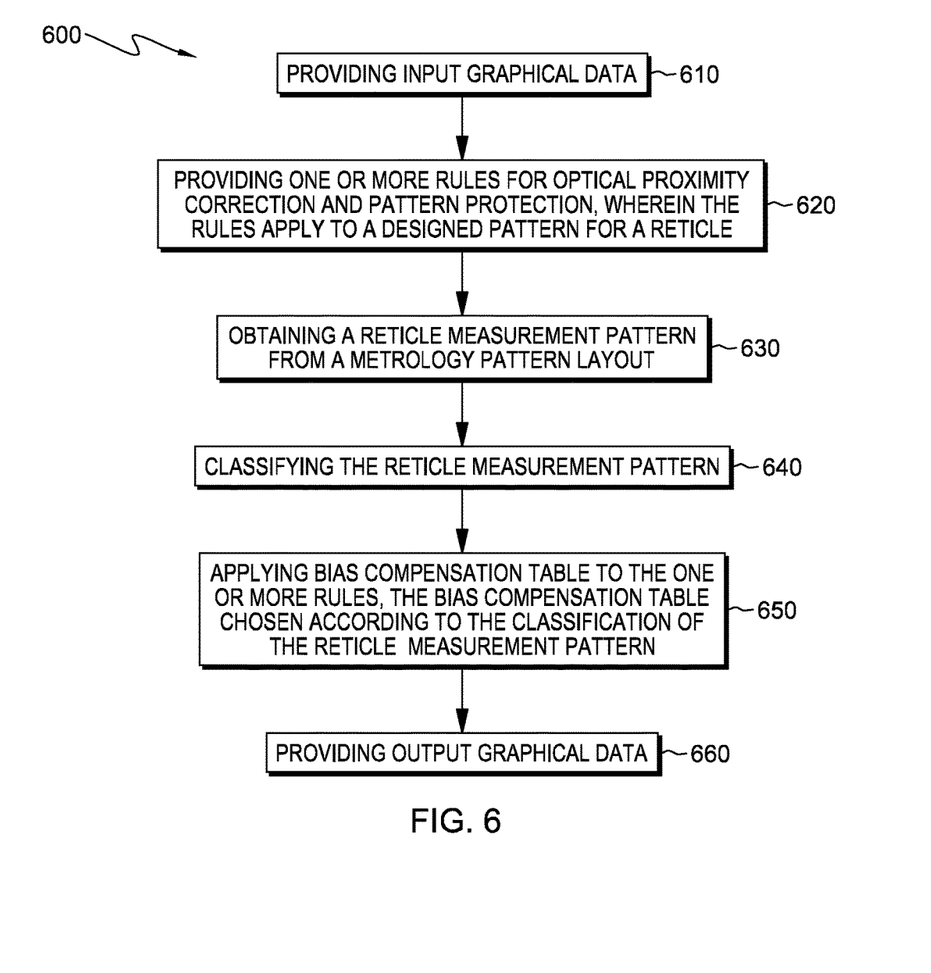
FIG. 6 summarizes a method including an optical proximity correction process, in which a reticle measurement pattern is utilized to provide one or more rules for the optical proximity correction process, in accordance with one or more aspects of the invention.

FIG. 6, by way of summary, outlines a method of optical proximity correction to be applied to a reticle measurement pattern. The OPC process may be a rule-based OPC process, which applies a pre-determined set of rules to a reticle, but possibly may be a model-based OPC process, in which successive iterative models of modifications to the reticle are generated until the best possible modifications are found. An input graphical data set is provided 610, which may be derived from at least part of the reticle design. One or more rules for optical proximity correction and pattern protection are provided 620. Generally, a rule set may be selected based on the input graphical data set obtained from the reticle. A reticle measurement pattern may further be obtained from a metrology pattern layout 630. The reticle measurement pattern may be a reticle measurement pattern sufficiently as described in one or more previous embodiments, and may be found in a metrology pattern layout on the reticle. The metrology pattern layout also may be a metrology pattern layout sufficiently as described above in one or more embodiments. The reticle measurement pattern is classified 640, generally according to the structural element or elements of the pattern. This may include outermost structural elements as described above in previous embodiments. Once the classification of the reticle measurement pattern has been made, a bias compensation table may be applied to the rule set 650. The bias compensation table may provide a set of special rules, in which any one special rule corresponds to the classification of the reticle measurement pattern. These special rules may be added to the rule set obtained above (at 620) or may possibly alter one or more rules. Finally, output graphical data is provided 660. This may be the result of applying the OPC process to the reticle. As a result of this process, the reticle measurement pattern may remain unaffected by the OPC process, as desired for obtaining accurate metrology data. As a result of this process, the reticle measurement pattern may also approach the process marginality of other metrology patterns, such as one or more of the wafer measurement patterns, that may undergo OPC processing without application of a set of special rules.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
   facilitating arrangement of a plurality of metrology patterns for a metrology pattern layout for a circuit structure comprising a plurality of quadrants:
      arranging a first quadrant for a first wafer measurement pattern that includes a plurality of structural elements containing measurement data for the first wafer;
      arranging a second quadrant for a second wafer measurement pattern that includes a plurality of structural elements containing measurement data for the second wafer;
      arranging a third quadrant for a reticle registration pattern that includes a plurality of structural elements containing registration data for the reticle;

arranging a fourth quadrant for a reticle measurement pattern that includes a plurality of structural elements containing measurement data for the reticle;

disposing a cross-shaped scribe area adjacent to one or more of the plurality of quadrants, the scribe area facilitating arrangement of one or more additional metrology patterns, the scribe area further comprising a center area, the center area comprising a pattern recognition metrology pattern, a double-patterning overlay metrology pattern, or a combination thereof, the scribe area being centrally disposed within the pattern layout, and wherein the scribe area separates the plurality of quadrants; and correlating data obtained from the first and second wafer measurement patterns with data obtained from the reticle measurement pattern and the reticle registration pattern.

2. The method of claim 1, wherein the first quadrant is arranged diagonally with respect to the second quadrant and the third quadrant is arranged diagonally with respect to the fourth quadrant.

3. The method of claim 1, wherein arranging the first quadrant isolates the reticle registration pattern from the others of the plurality of metrology patterns, such that distortion of the reticle registration pattern is minimized when scanned by a metrology tool.

4. The method of claim 1, wherein the fourth quadrant comprises the reticle measurement pattern, the reticle measurement pattern comprising a plurality of structural elements, wherein at least one structural element is an at least one outermost structural element, the at least one outermost structural element being designed to protect the plurality of structural elements from modification in an optical proximity correction process.

5. The method of claim 4, wherein the at least one outermost structural element has at least one size dimension larger than a pre-defined critical dimension for the reticle.

6. The method of claim 5, wherein the at least one size dimension is approximately two times larger than the pre-defined critical dimension for the reticle.

7. The method of claim 4, wherein the at least one outermost structural element is one outermost structural element of a plurality of outermost structural elements.

8. The method of claim 1, comprising arranging two metrology patterns for the at least one of the plurality of quadrants further facilitates arrangement of two metrology patterns, wherein the first metrology pattern corresponds to a first exposure layer of a double patterning process and the second metrology pattern corresponds to a second exposure layer of the double patterning process, the two metrology patterns facilitating overlay metrology for the double patterning process.

9. The method of claim 8, wherein the fourth quadrant comprises a first reticle measurement pattern and a second reticle measurement pattern, the first reticle measurement pattern comprising a plurality of first structural elements with at least one first outermost structural element, the at least one first outermost structural element being designed to protect the plurality of first structural elements from modification in an optical proximity correction process, and the second reticle measurement pattern comprising a plurality of second structural elements with at least one second outermost structural element, the at least one second outermost structural element being designed to protect the plurality of second structural elements from modification in an optical proximity correction process.

10. The method of claim 1, wherein the metrology pattern layout is a first metrology pattern layout designed for a first metal layer of a circuit structure design, and wherein the first metrology pattern layout may be rotated by 90° to provide a second metrology pattern layout for a second metal layer of the circuit structure design.

11. The method of claim 1, wherein the scribe area is a square-shaped scribe area, the square-shaped scribe area forming, at least in part, a border of the pattern layout, and wherein the plurality of quadrants are disposed within the square-shaped scribe area.

12. The method of claim 1, wherein the one or more additional metrology patterns are one or more double-patterning overlay metrology patterns.

13. The method of claim 1, wherein the one or more additional metrology patterns are one or more metal layer overlay metrology patterns.

14. The method of claim 1, wherein the one or more additional metrology patterns are one or more via layer metrology patterns.

15. The method of claim 1, wherein the metrology pattern layout comprises a defined surface area, the defined surface area comprising a surface area of the plurality of quadrants and the scribe area, the defined surface area facilitating placement of the structure within an active region of a reticle pattern or within an active region of a wafer pattern.

16. The method of claim 15, wherein the surface area is less than about 25 $\mu m^2$.

17. A method comprising:

facilitating arrangement of a plurality of metrology patterns for a metrology pattern layout for a circuit structure comprising a plurality of quadrants:

arranging a first quadrant for a first wafer measurement pattern that includes a plurality of structural elements containing measurement data for the first wafer;

arranging a second quadrant for a second wafer measurement pattern that includes a plurality of structural elements containing measurement data for the second wafer;

arranging a third quadrant for a reticle registration pattern that includes a plurality of structural elements containing registration data for the reticle;

arranging a fourth quadrant for a reticle measurement pattern that includes a plurality of structural elements containing measurement data for the reticle;

correlating data obtained from the first and second wafer measurement patterns with data obtained from the reticle measurement pattern and the reticle registration pattern;

arranging two metrology patterns for the at least one of the plurality of quadrants further facilitates arrangement of two metrology patterns, wherein the first metrology pattern corresponds to a first exposure layer of a double patterning process and the second metrology pattern corresponds to a second exposure layer of the double patterning process, the two metrology patterns facilitating overlay metrology for the double patterning process; and wherein the fourth quadrant comprises a first reticle measurement pattern and a second reticle measurement pattern, the first reticle measurement pattern comprising a plurality of first structural elements with at least one first outermost structural element, the at least one first outermost structural element being designed to protect the plurality of first structural elements from modification in an optical proximity correction process, and the second reticle measurement pattern comprising a plurality of second structural elements with at least one second outermost structural element, the at least one second outermost structural element being designed to protect the plurality of second structural elements from modification in an optical proximity correction process.

18. The method of claim 17, wherein the metrology pattern layout further comprises a scribe area adjacent to one or more of the plurality of quadrants, the scribe area facilitating arrangement of one or more additional metrology patterns.

19. The method of claim 18, wherein the scribe area comprises a cross-shaped scribe area, the cross-shaped scribe area being centrally disposed within the pattern layout, and wherein the scribe area separates the plurality of quadrants.

20. The method of claim 19, wherein the cross-shaped scribe area further comprises a center area, the center area comprising a pattern recognition metrology pattern, a double-patterning overlay metrology pattern, or a combination thereof.

* * * * *